United States Patent
Kim et al.

(10) Patent No.: US 7,816,222 B2
(45) Date of Patent: Oct. 19, 2010

(54) METHOD FOR MANUFACTURING SEMICONDUCTOR DEVICE HAVING A CAPACITOR

(75) Inventors: Jong Kuk Kim, Suwon-si (KR); Seung Bum Kim, Seoul (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 106 days.

(21) Appl. No.: 12/127,340

(22) Filed: May 27, 2008

(65) Prior Publication Data
US 2009/0085159 A1 Apr. 2, 2009

(30) Foreign Application Priority Data
Sep. 28, 2007 (KR) .................. 10-2007-0098455

(51) Int. Cl.
*H01L 21/8242* (2006.01)
(52) U.S. Cl. .................. 438/396; 438/239; 438/250; 438/253; 438/254; 438/397; 257/E21.011
(58) Field of Classification Search ............ 438/239, 438/250, 253–254, 396–397
See application file for complete search history.

(56) References Cited
U.S. PATENT DOCUMENTS
7,153,740 B2* 12/2006 Kim et al. ............ 438/253
2003/0124796 A1 7/2003 Jeon et al.
2005/0153518 A1 7/2005 You et al.
2007/0093022 A1* 4/2007 Basceri et al. ............ 438/244

FOREIGN PATENT DOCUMENTS
| KR | 100549951 | 2/2006 |
| KR | 102007000077 | 1/2007 |
| KR | 102007004492 | 5/2007 |
| KR | 100844983 | 7/2008 |

OTHER PUBLICATIONS
Notice of Preliminary Rejection issued from Chinese State Intellectual Property Office on Jun. 30, 2010.

* cited by examiner

*Primary Examiner*—Thanh Nguyen
(74) *Attorney, Agent, or Firm*—IP & T Law Firm PLC

(57) ABSTRACT

A semiconductor device and a method for manufacturing the same are provided. The semiconductor device includes cylinder type bottom electrodes connected to a contact plug formed over a semiconductor substrate, and a supporting pattern formed between the cylinder type bottom electrodes, wherein a portion of sidewalls of the bottom electrodes is higher than the supporting pattern and the other portion of the sidewalls of the bottom electrode is lower than the supporting pattern.

14 Claims, 8 Drawing Sheets

METHOD FOR MANUFACTURING SEMICONDUCTOR DEVICE HAVING A CAPACITOR

This application is based upon and claims the benefit of priority to Korean Patent Application No. 10-2007-98455, filed on Sep. 28, 2007, the entire contents of which are incorporated herein by reference.

I. BACKGROUND

Embodiments consistent with the present invention generally relate to a semiconductor device and a method for manufacturing the same, and more specifically, to a semiconductor device having a capacitor and a method for manufacturing the same.

Due to the increased demand in the capacity of semiconductor memory devices, which include capacitors, various technologies have been developed to increase the capacitance of the capacitor.

In general, a capacitor has a structure, which includes a dielectric film formed between a bottom electrode (or a storage node) and a top electrode (or a plate electrode). Capacitance of the capacitor is proportional to an electrode surface area and a dielectric constant of the dielectric film, and is inversely proportional to an interval of the top and bottom electrodes, that is, a thickness of the dielectric film.

In order for the capacitor to have a high capacitance, various methods can be employed to fabricate the capacitor. For example, one can use a dielectric film having a large dielectric constant, reduce the thickness of the dielectric film, increase the electrode surface area, or reduce the distance between the top and bottom electrodes.

However, as the device size becomes smaller due to increased integration of the semiconductor memory device, it is difficult to fabricate a capacitor with a small size, yet securing sufficient capacitance.

To secure a sufficient capacitance, researchers have focused their attention to the structure of the bottom electrode. As a result, a concave type (or cylinder type) capacitor having a three-dimensional structure has been developed.

Recently, the cylinder type capacitor using both an external surface and an internal surface as a node surface has been widely used, rather than using only the internal surface as a node surface. Generally, the cylinder type capacitor is formed by a dip-out process.

Although the capacitance of a capacitor may be increased by increasing the height of the capacitor, a capacitor leaning phenomenon may occur as a result of the height increase.

II. SUMMARY

Disclosed are a semiconductor device and a method for manufacturing the same.

According to one embodiment consistent with the present invention, the method includes forming a first sacrificial insulating film over a semiconductor substrate, forming a supporting layer over the first sacrificial insulating film, forming a second sacrificial insulating film over the supporting layer, etching the second sacrificial insulating film, the supporting layer, and the first sacrificial insulating film to form a bottom electrode region, the bottom electrode region exposing a contact plug formed over the semiconductor substrate, forming a bottom electrode conductive layer over the resulting structure after the bottom electrode region is formed, planarizing the bottom electrode conductive layer to expose the second sacrificial insulating film, forming a third sacrificial insulating film over the resulting structure after planarizing the bottom electrode conductive layer, etching the third sacrificial insulating film, the second sacrificial insulating film, and the supporting layer to form a third sacrificial insulating pattern, a second sacrificial pattern, and a supporting pattern between the bottom electrode and a neighboring bottom electrode, and removing the first, the second, and the third sacrificial insulating patterns to form a bottom electrode.

According to one embodiment consistent with the present invention, the semiconductor device includes cylinder type bottom electrodes connected to a contact plug formed over a semiconductor substrate, and a supporting pattern formed between the cylinder type bottom electrodes, wherein a portion of sidewalls of the bottom electrodes is higher than the supporting pattern and the other portion of the sidewalls of the bottom electrode is lower than the supporting pattern.

III. BRIEF DESCRIPTION OF THE DRAWINGS

IV. DETAILED DESCRIPTION

FIGS. 1a through 1f are cross-sectional diagrams illustrating a method for manufacturing a semiconductor device consistent with the present invention.

Figure 1A:
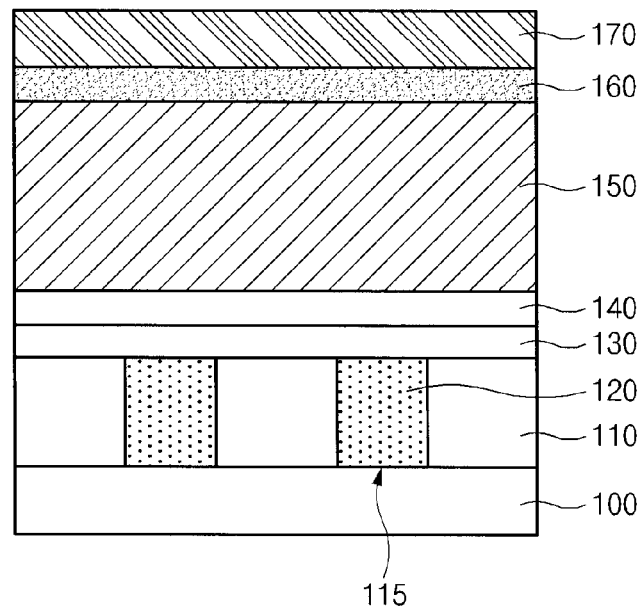
FIGS. 1a through 1f are cross-sectional diagrams illustrating a method for manufacturing a semiconductor device consistent with the present invention.

Referring to FIG. 1a, a first interlayer insulating film 110 is formed over a semiconductor substrate 100. A photoresist film may be formed over first interlayer insulating film 110. An exposure and developing process may be performed on the photoresist film using an exposure mask to form a photoresist pattern (not shown). First interlayer insulating film 110 may be etched using the photoresist pattern as a mask to form a bottom electrode contact hole 115 that exposes portions of semiconductor substrate 100.

The photoresist pattern may be removed and a bottom electrode contact plug 120 may be formed in bottom electrode contact hole 115. In one embodiment, bottom electrode contact plug 120 may be formed by filling a contact material in bottom electrode contact hole 115 and planarizing the contact material to obtain bottom electrode contact plug 120.

A second interlayer insulating film 130, an etching barrier film 140, a first sacrificial insulating film 150, a supporting layer 160, and a second sacrificial insulating film 170 may be sequentially formed over the resulting structure after bottom electrode contact plug 120 is formed. First sacrificial insulating film 150 may comprise TEOS, USG, BPSG, PSG, SOD, HDP, SROX, SOG, or combinations thereof. Supporting layer 160 may comprise a nitride film having a thickness ranging from about 300 Å to about 2000 Å. Second sacrificial insulating film 170 may be formed to have a thickness ranging from about 500 Å to about 5000 Å.

A photoresist film (not shown) may be formed over second sacrificial insulating film 170. An exposure and developing process may be performed on the photoresist film using a bottom electrode mask to form a photoresist pattern (not shown).

Figure 1B:
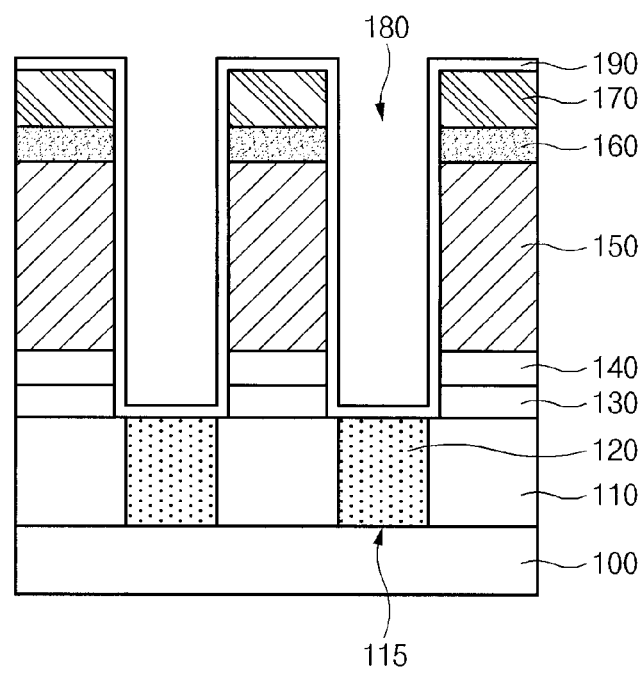

Referring to FIG. 1b, second sacrificial insulating film 170, supporting layer 160, first sacrificial insulating film 150, etching barrier film 140, and second interlayer insulating film 130 may be etched using the photoresist pattern (not shown) to form a bottom electrode region 180 that exposes bottom electrode contact plug 120.

First sacrificial insulating film 150 and second sacrificial insulating film 170 may be etched using $SF_6$ and $Cl_2$ as a main gas, and one of Ar, $N_2$, $O_2$, fluorocarbon, and combinations thereof, as an additional gas.

A bottom electrode conductive layer 190 may be formed over the resulting structure after bottom electrode region 180 is formed. Bottom electrode conductive layer 190 may comprise one of Ti, TiN, and a combination thereof, and may have a thickness ranging from about 200 Å to about 2000 Å.

Figure 1C:
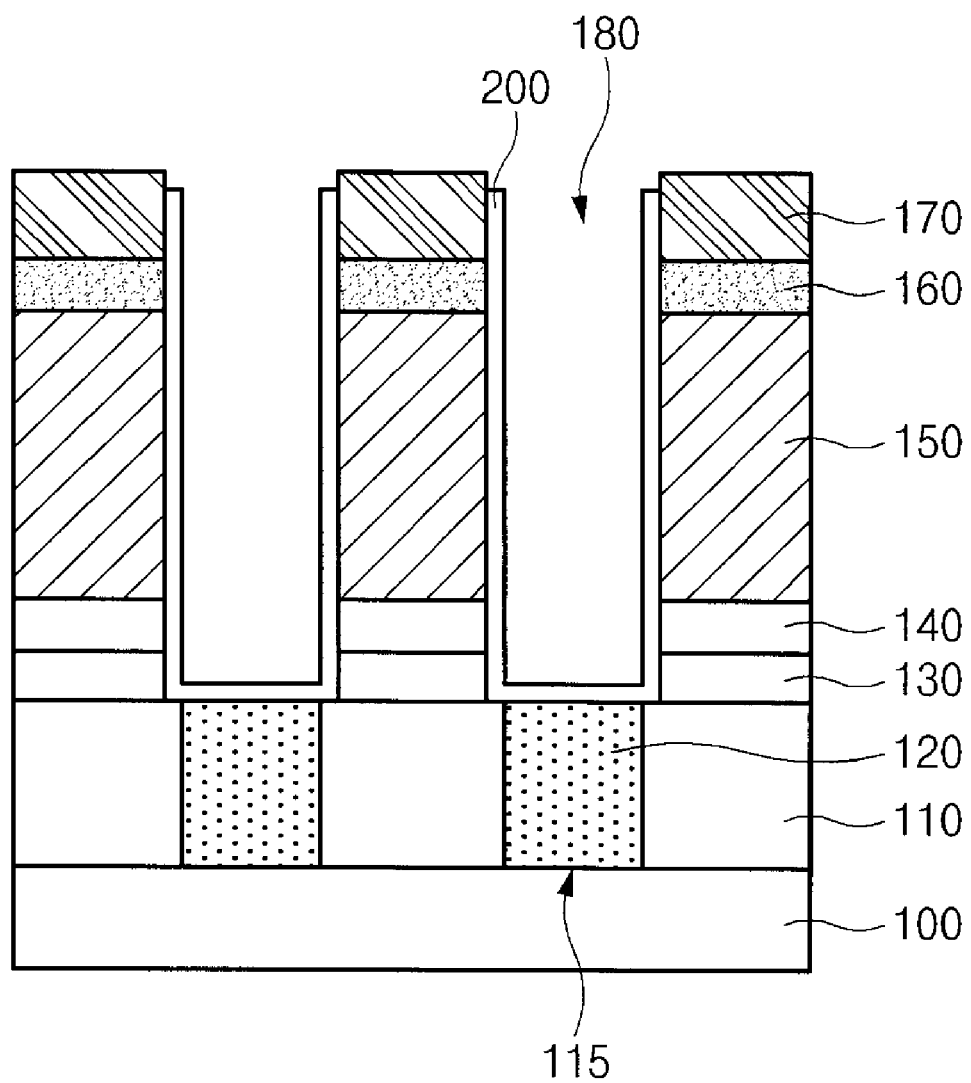

Referring to FIG. 1c, a filling insulating film (not shown) for covering bottom electrode region 180 may be formed over the resulting structure after bottom electrode conductive layer 190 is formed. The filling insulating film and bottom electrode conductive layer 190 are planarized until second sacrificial insulating film 170 is exposed, and a bottom electrode 200 is thus formed. In one embodiment, bottom electrode 200 may be a cylindrical shell with a closed lower end and an open upper end. The closed lower end electrically contacts bottom electrode contact plug 120. The filling insulating film may comprise a photoresist film and an oxide film. In the planarizing step, bottom electrode conductive layer 190 of FIG. 1b may be further etched from an upper surface of second sacrificial insulating film 170 by about 100 Å to about 2000 Å. The filling insulating film remaining in bottom electrode region 180 is then removed.

Figure 1D:
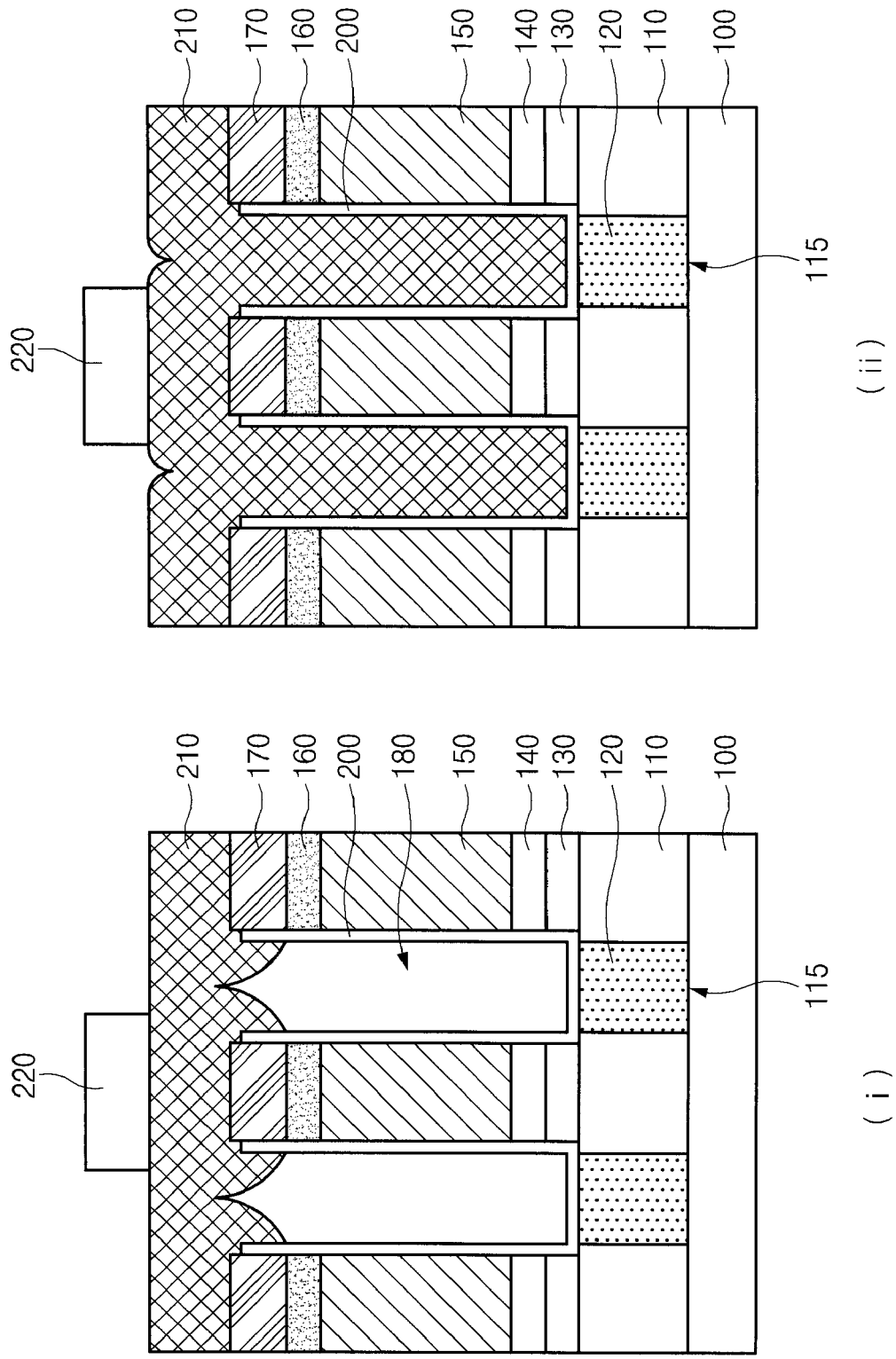

Referring to FIG. 1d (i), a third sacrificial insulating film 210 is formed over the resulting structure after the planarization step that exposes second sacrificial insulating film 170. Third sacrificial insulating film 210 may be formed with a low step coverage.

That is, third sacrificial insulating film 210 may be formed on second sacrificial insulating film 170 and fill only an upper portion of bottom electrode region 180.

Alternatively, as shown in FIG. 1d (ii), third sacrificial insulating film 210 may be formed with a high step coverage.

That is, third sacrificial insulating film 210 may be formed on second sacrificial insulating film 170 and fill the entire space of bottom electrode region 180.

Third sacrificial insulating film 210 may comprise a Tetra-ethylorthosilicate (TEOS) film, which may be formed by a plasma enhanced chemical vapor deposition (PECVD) process in a vacuum chamber at a temperature ranging from about 300° C. to about 500° C. The TEOS film, which may be used to form third sacrificial insulating film 210, may be formed by making liquid TEOS into bubbles with a He gas and flowing the bubble-type TEOS at a gaseous state into the vacuum chamber to plasmarize the gaseous TEOS with $O_2$ via a PECVD method.

Referring again to FIG. 1d, third sacrificial insulating film 210 is planarized and a photoresist pattern 220 is formed over third sacrificial insulating film 210.

Photoresist pattern 220 covers an interval between neighboring bottom electrodes and a portion of sidewalls of neighboring bottom electrodes 200, so as to protect supporting layer 160 between bottom electrodes 200. Then, third sacrificial insulating film 210 may be exposed and developed using photoresist pattern 220 as an additional exposure mask.

Figure 2A:
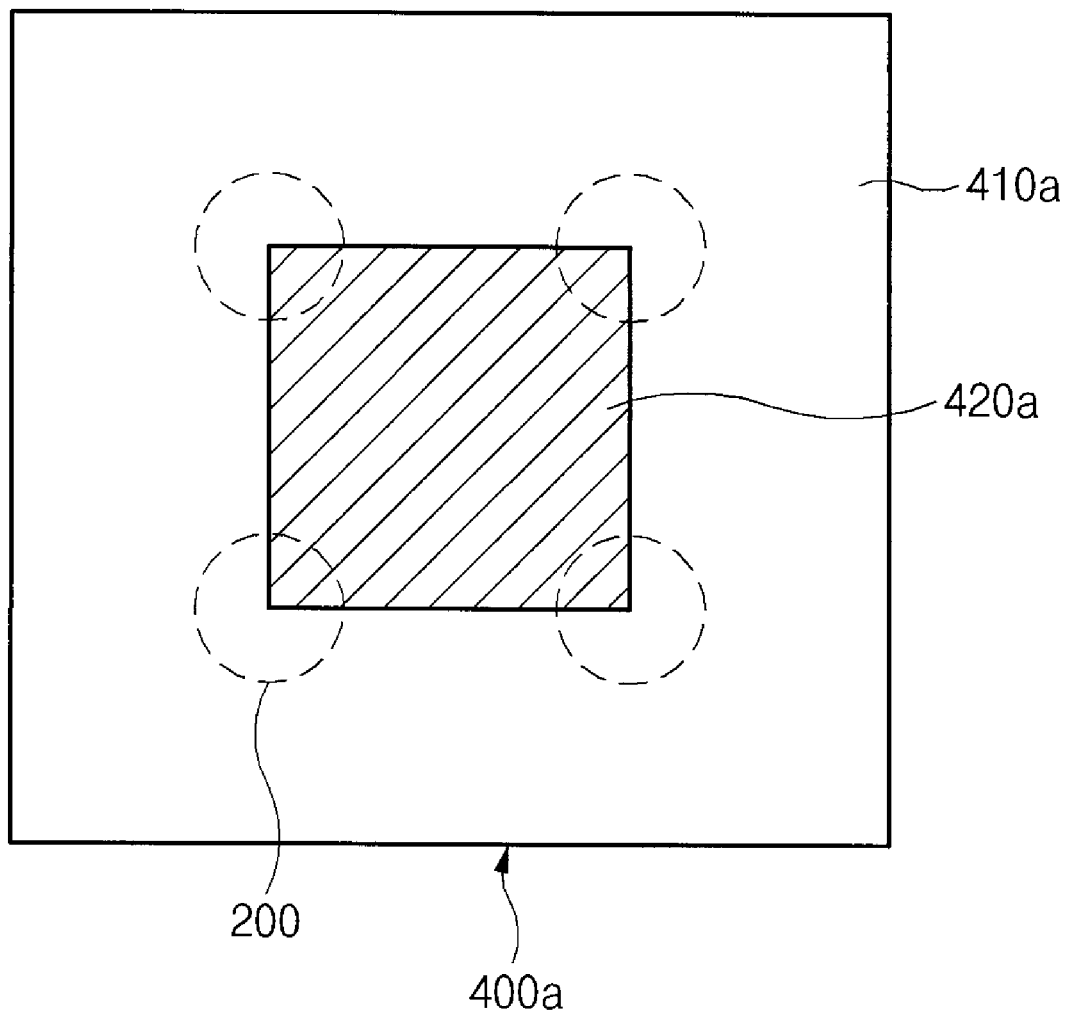
FIGS. 2a through 2c are plane diagrams illustrating an exposure mask consistent with the present invention.

In one embodiment, photoresist pattern 220 of FIG. 1d may be formed in accordance with a pad type shading pattern 420a of an exposure mask 400a (see FIG. 2a). Photoresist pattern 220 overlaps with a portion of sidewalls of neighboring bottom electrodes 200. In another embodiment, photoresist pattern 220 of FIG. 1d may be formed in accordance with a closed curve type shading pattern 420b of an exposure mask 400b (see FIG. 2b). In another embodiment, photoresist pattern 220 of FIG. 1d may be formed in accordance with a one-by-one overlapped type shading pattern 420c or a rectangular shaped pattern 420c of an exposure mask 400c (see FIG. 2c).

Figure 1E:
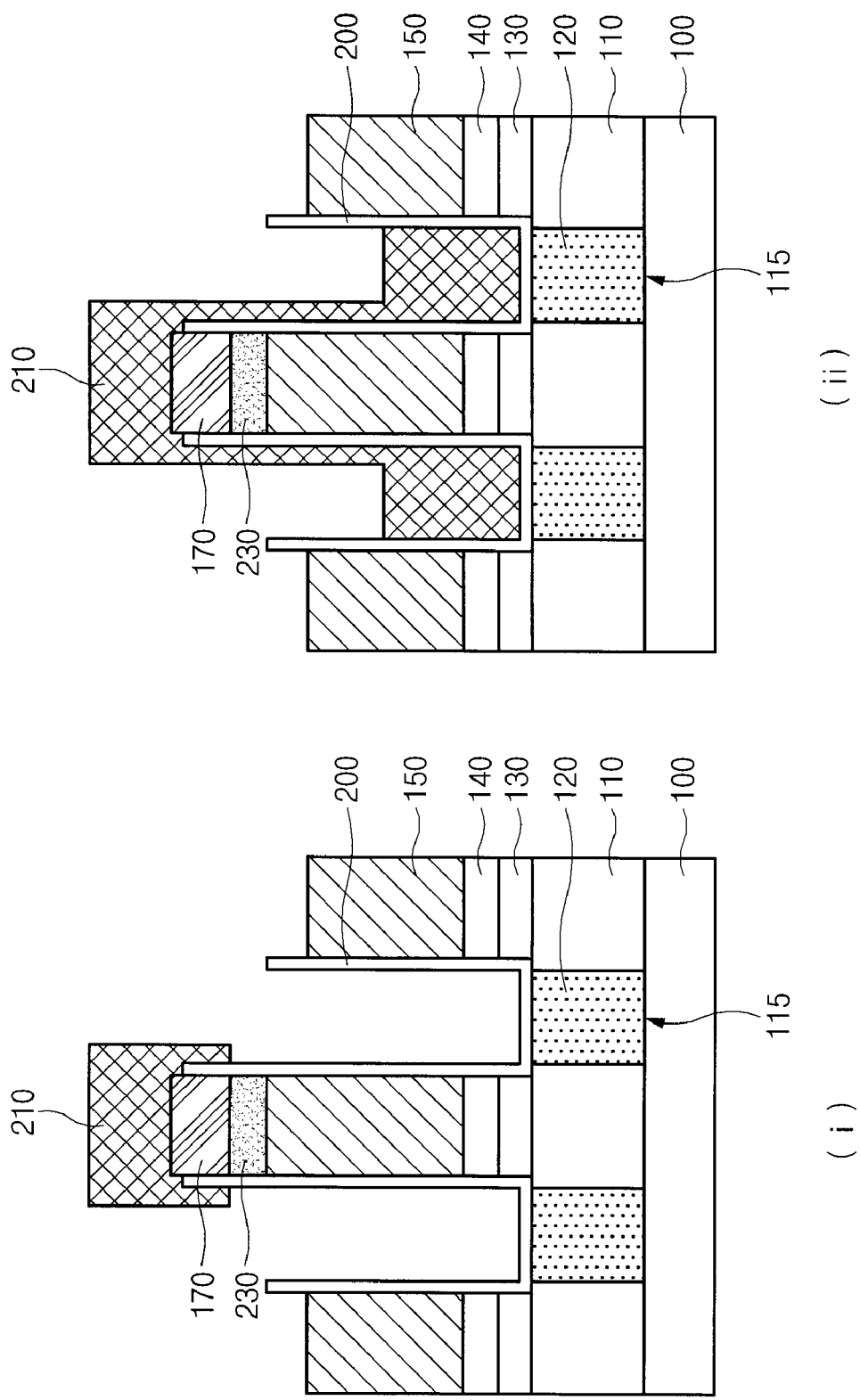

Referring to FIG. 1e, third sacrificial insulating film 210, second sacrificial insulating film 170, and supporting layer 160 are etched using photoresist pattern 220 as an etching mask. As a result, portions of supporting layer 160 not being etched form a supporting pattern 230. Photoresist pattern 220 is then removed.

As shown in FIG. 1e, portions of the sidewalls of bottom electrodes 200 overlapped with photoresist pattern 220 is higher than supporting pattern 230. Portions of the sidewalls of bottom electrodes 200 not overlapped with photoresist pattern 220 is lower than supporting pattern 230.

An etching selectivity difference between second sacrificial insulating film 170 and supporting layer 160 may reduce damages to bottom electrode 200.

Figure 1F:
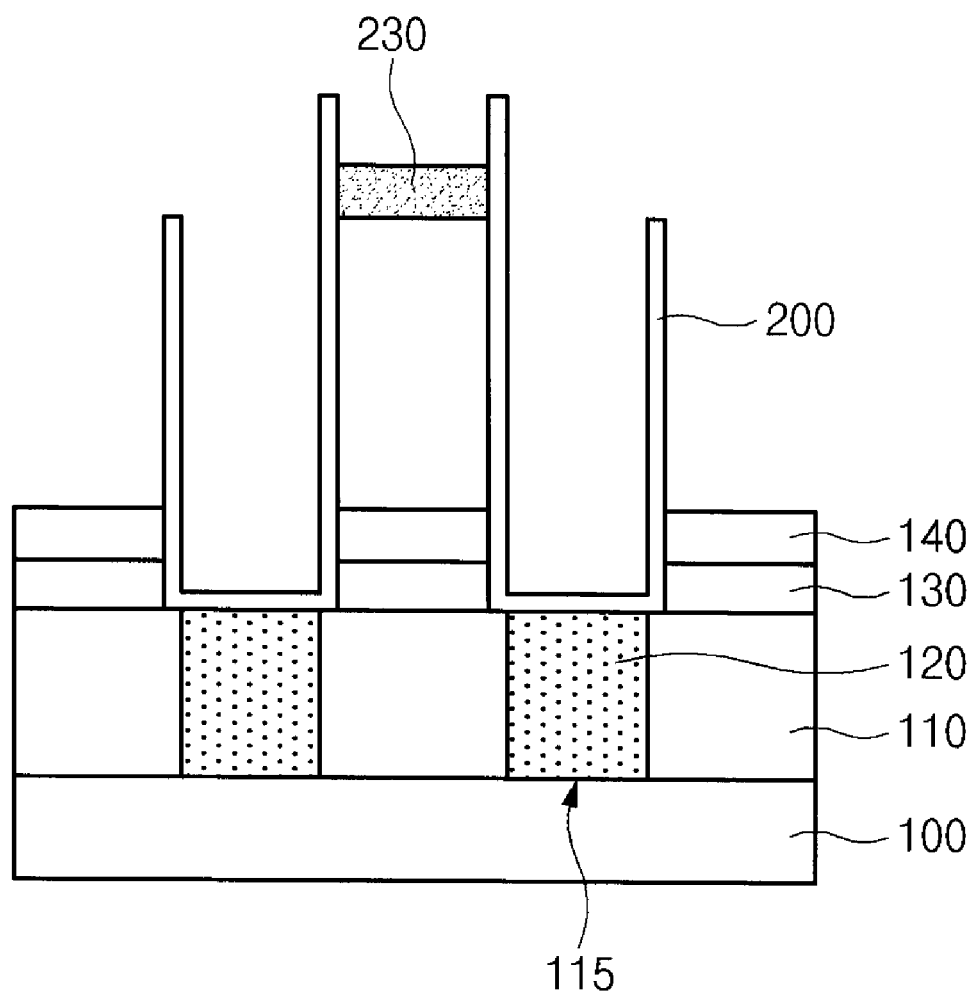

Referring to FIG. 1f, a dip-out process is performed to remove first sacrificial insulating film 150. The dip-out process is performed using an etching selectivity difference between first sacrificial insulating film 150 and other structures to remove second sacrificial insulating film 170 and third sacrificial insulating film 210 around supporting pattern 230.

A dielectric film (not shown) may be formed on bottom electrode 200. A top electrode (not shown), which may be a plate electrode, may be formed on the dielectric film. Bottom electrode 200 and the top electrode thus form a capacitor.

Figure 2B:
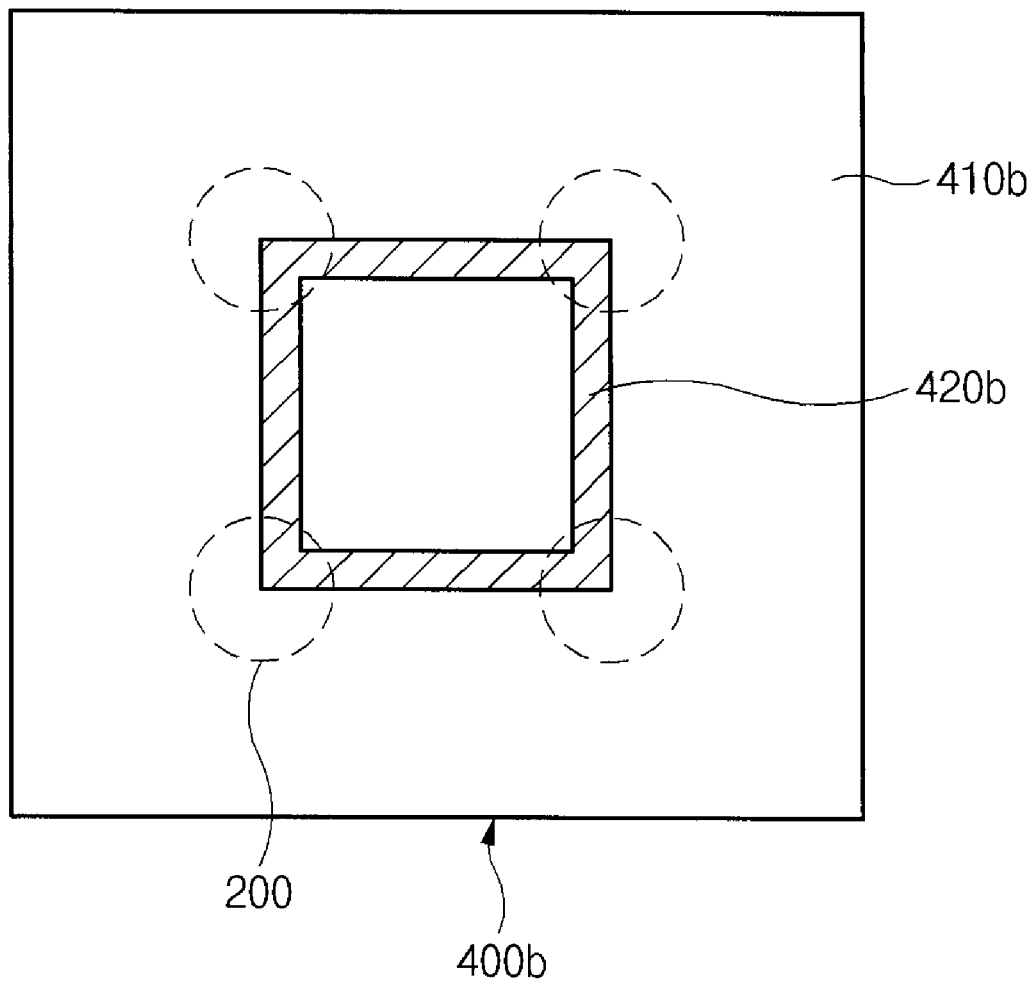
Figure 2C:
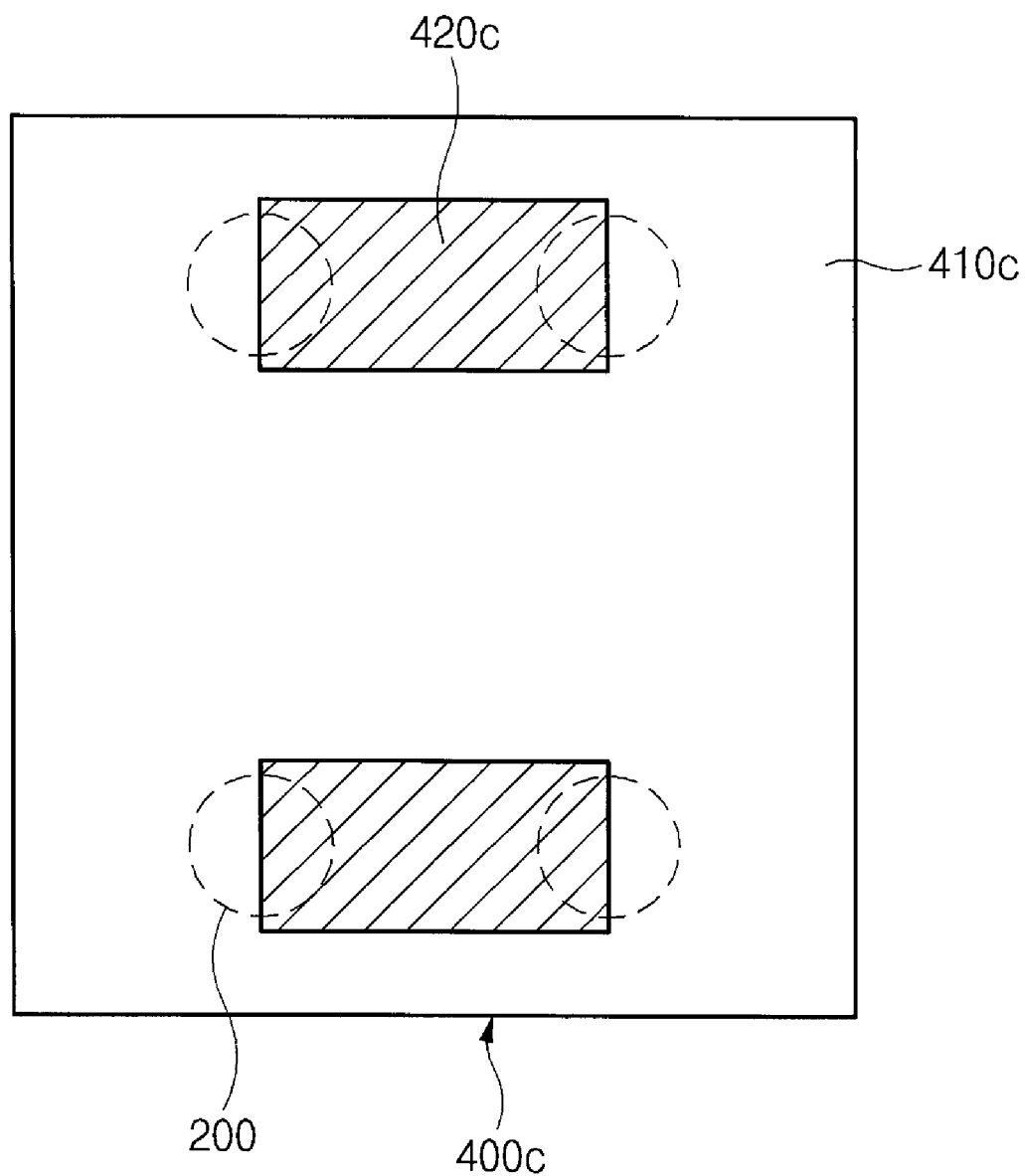

FIGS. 2a through 2c are plane diagrams illustrating exposure masks consistent with the present invention.

Referring to FIG. 2a, an exposure mask 400a includes a transparent substrate 410a and a pad type shading pattern 420a formed on transparent substrate 410a. In one embodiment, pad type shading pattern 420a may be of a square shape and may overlap and cover a portion of the sidewalls of neighboring bottom electrodes 200.

Referring to FIG. 2b, an exposure mask 400b includes a transparent substrate 410b and a closed curve type shading pattern 420b. In one embodiment, closed curve type shading pattern 420b may be of a square ring shape and may overlap and cover a portion of the sidewalls of neighboring bottom electrodes 200.

Referring to FIG. 2c, an exposure mask 400c includes a transparent substrate 410c and a one-by-one type shading pattern 420c. In one embodiment, one-by-one type shading pattern 420c may be of a rectangular shape and may overlap and cover a portion of the sidewalls between two neighboring bottom electrodes 200. Although a number of illustrative embodiments consistent with the present invention has been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the appended claims. In addition to variations and modifications in the component parts and/or arrangements, alternative uses will also be apparent to those skilled in the art.

What is claimed is:

1. A method for manufacturing a semiconductor device, comprising:

forming a first sacrificial insulating film over a semiconductor substrate;

forming a supporting layer over the first sacrificial insulating film;

forming a second sacrificial insulating film over the supporting layer;

etching the second sacrificial insulating film, the supporting layer, and the first sacrificial insulating film to form a bottom electrode region, the bottom electrode region exposing a contact plug formed over the semiconductor substrate;

forming a bottom electrode conductive layer over the resulting structure after the bottom electrode region is formed;

planarizing the bottom electrode conductive layer to expose the second sacrificial insulating film;

forming a third sacrificial insulating film over the resulting structure after planarizing the bottom electrode conductive layer;

etching the third sacrificial insulating film, the second sacrificial insulating film, and the supporting layer to form a third sacrificial insulating pattern, a second sacrificial pattern, and a supporting pattern between the bottom electrode and a neighboring bottom electrode; and removing the first, the second, and the third sacrificial insulating patterns to form a bottom electrode.

2. The method according to claim 1, wherein the first, the second, and the third sacrificial insulating films comprise an oxide film.

3. The method according to claim 1, wherein the first sacrificial insulating film and the second sacrificial insulating film comprise one selected from the group consisting of TEOS, USG, BPSG, PSG, SOD, HDP, SROX, SOG, and combinations thereof.

4. The method according to claim 1, wherein the supporting layer comprises a nitride film having a thickness ranging from about 300 Å to about 2000 Å.

5. The method according to claim 1, wherein the supporting layer comprises a silicon nitride film.

6. The method according to claim 1, wherein the second sacrificial insulating film has a thickness ranging from about 500 Å to about 5000 Å.

7. The method according to claim 1, wherein the first sacrificial insulating film and the second sacrificial insulating film are etched using $SF_6$ and $Cl_2$ as a main gas, and using one selected from the group consisting of Ar, $N_2$, $O_2$, fluorocarbon, and combinations thereof, as an additional gas.

8. The method according to claim 1, wherein the bottom electrode conductive layer comprises one selected from the group consisting of Ti, TiN, and combinations thereof, and has a thickness ranging from about 200 Å to about 2000 Å.

9. The method according to claim 1, wherein planarizing the bottom electrode conductive layer further comprises:
forming an insulating film over the resulting structure after bottom electrode conductive layer is formed; and
planarizing the insulating film and the bottom electrode conductive layer on the second sacrificial insulating film to expose the second sacrificial insulating film; and
removing the insulating film remained in the bottom electrode region.

10. The method according to claim 1, wherein the bottom electrode conductive layer is further etched from an upper surface of the second sacrificial insulating film by about 100 Å to about 2000 Å.

11. The method according to claim 1, wherein the third sacrificial insulating film comprises a Tetraethylorthosilicate (TEOS) film formed by a plasma enhanced chemical vapor deposition (PECVD) process at a temperature ranging from about 300° C. to about 500° C.

12. The method according to claim 1, wherein etching the third sacrificial insulating film, the second sacrificial insulating film, and the supporting layer further comprises: forming a photoresist film over the third sacrificial insulating film;
performing an exposure and developing process using the photoresist film as an exposure mask to form a photoresist pattern; and
etching the third sacrificial insulating film, the second sacrificial insulating film, and the supporting layer to form the third sacrificial insulating pattern, the second sacrificial insulating pattern, and the supporting pattern to support sidewalls of the bottom electrode and the neighboring bottom electrode.

13. The method according to claim 12, wherein the exposure mask includes a shading pattern, the shading pattern having a pad shape, a closed curve shape, or a rectangular shape.

14. The method according to claim 13, wherein the shading pattern overlaps with a portion of the sidewalls of the bottom electrode and the neighboring bottom electrode.

* * * * *

UNITED STATES PATENT AND TRADEMARK OFFICE
CERTIFICATE OF CORRECTION

| | | Page 1 of 1 |
|---|---|---|
| PATENT NO. | : 7,816,222 B2 | |
| APPLICATION NO. | : 12/127340 | |
| DATED | : October 19, 2010 | |
| INVENTOR(S) | : Jong Kuk Kim et al. | |

It is certified that error appears in the above-identified patent and that said Letters Patent is hereby corrected as shown below:

Title page item (56) insert References Cited as follows:

FOREIGN PATENT DOCUMENTS
KR      100549951    2/2006
KR    1020070000776    1/2007
KR    1020070044929    5/2007
KR      100844983    7/2008

Signed and Sealed this

Twenty-third Day of November, 2010

David J. Kappos
*Director of the United States Patent and Trademark Office*